United States Patent
Yang et al.

(10) Patent No.: US 7,314,786 B1
(45) Date of Patent: Jan. 1, 2008

(54) METAL RESISTOR, RESISTOR MATERIAL AND METHOD

(75) Inventors: Chih-Chao Yang, Poughkeepsie, NY (US); Kaushik Chanda, Fishkill, NY (US); Shyng-Tsong Chen, Patterson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/420,121

(22) Filed: Jun. 16, 2006

(51) Int. Cl.
*H01L 21/338* (2006.01)
*H01L 21/8234* (2006.01)
*H01L 21/8222* (2006.01)

(52) U.S. Cl. .................. 438/171; 438/382; 438/384; 438/385; 438/210; 438/190; 438/238; 438/329; 438/330; 438/331; 438/332; 438/E21.006; 438/E21.009; 438/E21.161; 257/758; 257/532; 257/328

(58) Field of Classification Search .......... 438/382, 438/384–385, 171, 190, 210, 330, 331–332; 257/532, 328, E21.006, E21.009, E21.161
See application file for complete search history.

(56) References Cited

U.S. PATENT DOCUMENTS

| | | | |
|---|---|---|---|
| 6,083,785 A | 7/2000 | Segawa et al. | |
| 6,207,560 B1 | 3/2001 | Lee | |
| 6,232,042 B1 | 5/2001 | Dunn et al. | |
| 7,078,305 B2 * | 7/2006 | Olson | 438/382 |
| 7,078,786 B1 * | 7/2006 | Racanelli et al. | 257/536 |
| 7,122,898 B1 * | 10/2006 | Yang et al. | 257/751 |
| 2003/0151116 A1 * | 8/2003 | Cabral et al. | 257/532 |
| 2004/0027234 A1 | 2/2004 | Hashimoto et al. | |
| 2006/0138401 A1 * | 6/2006 | Yu et al. | 257/40 |

OTHER PUBLICATIONS

US 5,485,738, 01/1996, Morris (withdrawn)

* cited by examiner

*Primary Examiner*—Michael Lebentritt
*Assistant Examiner*—Mohsen Ahmadi
(74) *Attorney, Agent, or Firm*—Lisa U. Jaklitsch; Hoffman, Warnick & D'Alessandro LLC

(57) ABSTRACT

A metal resistor and resistor material and method of forming the metal resistor are disclosed. The metal resistor may include an infused metal selected from the group consisting of: copper (Cu) infused with at least one of silicon (Si), nitrogen ($N_2$), carbon (C), tantalum (Ta), titanium (Ti) and tungsten (W), and aluminum infused with at least one of silicon (Si), nitrogen ($N_2$), carbon (C), tantalum (Ta), titanium (Ti) and tungsten (W). The method is less complex than conventional processes, allows control of the resistance by the amount of infusion material infused, and is compatible with conventional BEOL processes.

5 Claims, 2 Drawing Sheets

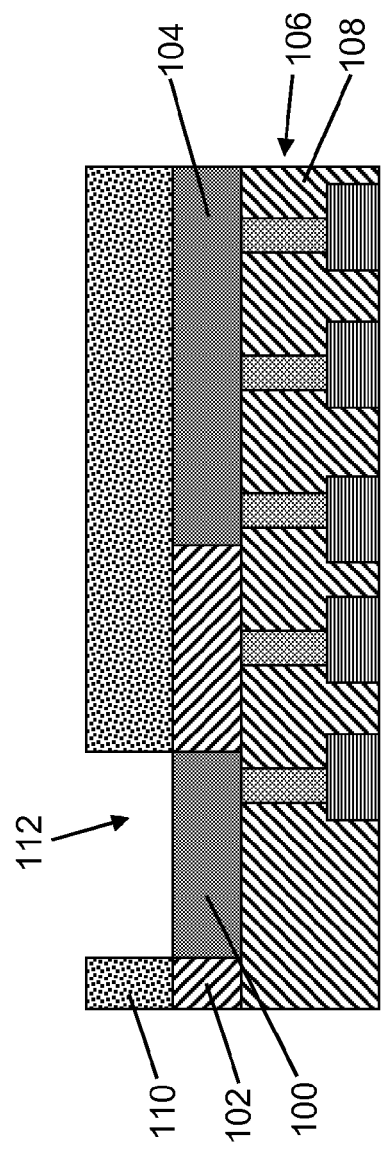
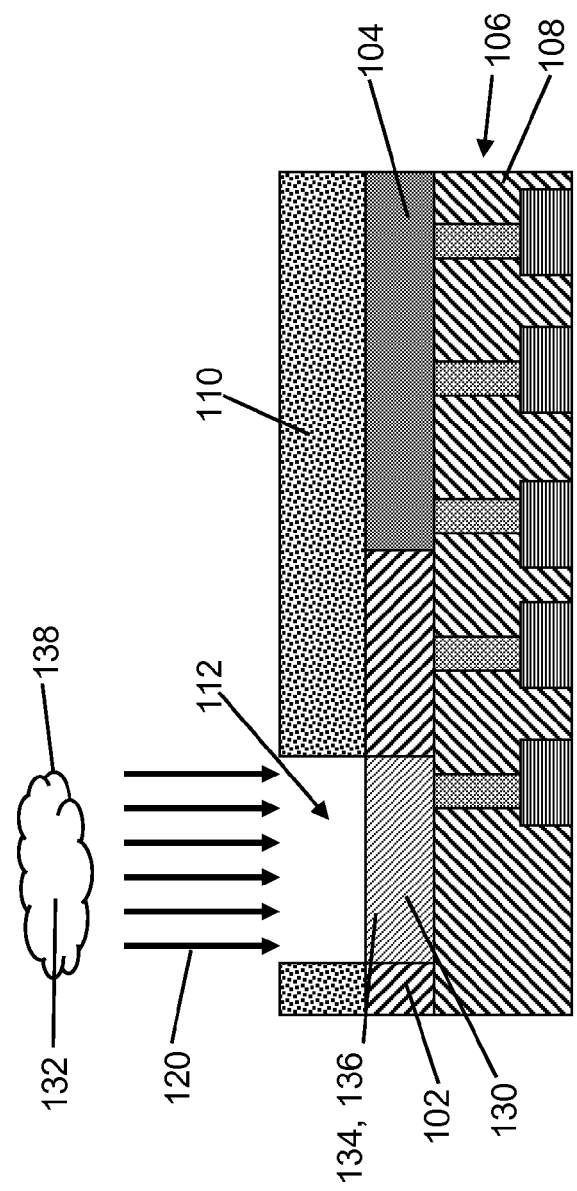
FIG. 1
FIG. 2

METAL RESISTOR, RESISTOR MATERIAL AND METHOD

BACKGROUND OF THE INVENTION

1. Technical Field

The invention relates generally to semiconductor fabrication, and more particularly, to a metal resistor and resistor material, and a method of forming the metal resistor.

2. Background Art

The resistor is one of the most common electrical components, and is used in almost every electrical device. In semiconductor device fabrication, it is well known to have thin film resistors embedded in the back-end-of-line (BEOL) structures of the chip through either a damascene approach or a subtractive etch method. The BEOL thin film resistors are preferred over other types of resistors because of the lower parasitic capacitance. Conventional resistor materials and fabrication methods, however, present a number of challenges.

In one approach, the sheet resistivity of the various resistors formed over the entire wafer may vary and go beyond specifications due to poor process control. In an advanced manufacturing line, wafers out of speciation are often scrapped for quality control, which is expensive.

One material used for resistors is doped polysilicon. A problem with this conventional resistor material is that it can only provide a limited resistance within a limited dimension, which presents problems as further miniaturization of the device features continues. Resistive thin films such as chromium silicide (CrSi) and tantalum nitride (TaN) are also used as resistors in semiconductor devices.

Integration schemes used to fabricate the resistor components within the interconnect structure fall into two primary categories. In the first integration scheme, a thin film resistor is formed by etching on top of an insulator. A metallic layer is deposited on top of the resistive layer and is used to protect the resistive layer from being damaged during the sequential etching process. After the resistor has been defined, the underneath dielectric is then patterned and etched to define the interconnect pattern. Finally, a metallic layer for the interconnect is deposited, patterned, and etched. This process presents challenges because, although the protective layer is capable of protecting the resistive layer, the provided protection is limited and the resistive layer may still get damaged during the etching process. This approach also requires extra layers, which adds cost and complexity. In the second integration scheme, a thin film resistor is formed by etching on top of an insulator. An interlevel dielectric is then deposited, followed by patterning and etching processes to define an upper level interconnect structure with vias connected to the underneath thin film resistor. A planarization process is usually required after deposition of the interlevel dielectric material in order to compromise any possible topography related issues caused by the underneath resistors. The planarization process adds expense.

Setting the resistance of the resistors also presents challenges. In one approach, resistors can be trimmed using laser or high-energy particle beam to set the resistance thereof. But, these processes are not clean and therefore have never become a common practice. Resistors can also be programmed by using a shunt transistor to deselect at least a portion of the resistor from a chain of the resistor circuit. This approach has at least a couple of problems. First, the resolution of the programming is limited by the least significant bit (LSB) device size, and the shunt device itself has some resistance. The tuning precision using this approach is thus poor.

In view of the foregoing, there is a need in the art for a solution to the problems of the related art.

SUMMARY OF THE INVENTION

A metal resistor and resistor material and method of forming the metal resistor are disclosed. The metal resistor may include an infused metal selected from the group consisting of: copper (Cu) infused with at least one of silicon (Si), nitrogen ($N_2$), carbon (C), tantalum (Ta), titanium (Ti) and tungsten (W), and aluminum infused with at least one of silicon (Si), nitrogen ($N_2$), carbon (C), tantalum (Ta), titanium (Ti) and tungsten (W). The method is less complex than conventional processes, allows control of the resistance by the amount of infusion material infused, and is compatible with conventional BEOL processes.

A first aspect of the invention provides a method of forming a metal resistor, the method comprising: providing a metal portion in a dielectric; and infusing the metal portion with an infusion species that increases a resistivity of the metal portion to form the resistor.

A second aspect of the invention provides a metal resistor comprising: an infused metal selected from the group consisting of: copper (Cu) infused with at least one of silicon (Si), nitrogen ($N_2$), carbon (C), tantalum (Ta), titanium (Ti) and tungsten (W), and aluminum infused with at least one of silicon (Si), nitrogen ($N_2$), carbon (C), tantalum (Ta), titanium (Ti) and tungsten (W).

A third aspect of the invention provides a resistor material comprising one of: copper (Cu) infused with at least one of silicon (Si), nitrogen ($N_2$), carbon (C), tantalum (Ta), titanium (Ti) and tungsten (W), and aluminum infused with at least one of silicon (Si), nitrogen ($N_2$), carbon (C), tantalum (Ta), titanium (Ti) and tungsten (W).

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1-4 show a method of forming a metal resistor, a resistor material and a metal resistor according to various embodiments of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 3:
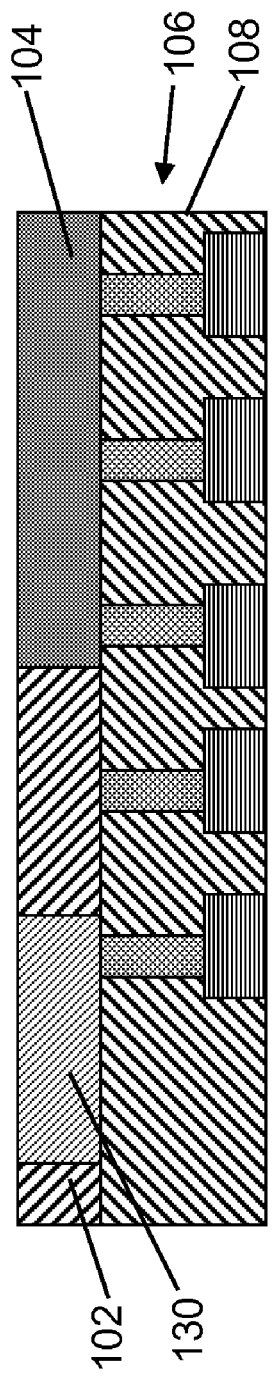

Referring to the drawings, one embodiment of a method of forming a metal resistor 130 (FIG. 2) will be described. First, in FIG. 1, a metal portion 100 is provided in a dielectric 102. Metal portion 100 may be positioned at a same level as a laterally extending interconnect wire 104. Metal portion 100 and interconnect wire 104 may include a metal such as copper (Cu) or aluminum (Al). Metal portion 100 and interconnect wire 104 do not necessarily have to be of the same material. Dielectric 102 may include any now known or later developed insulator material such as hydrogenated silicon oxycarbide (SiCOH), SiLK® available from Dow Chemical, porous dielectrics, etc. A layer 106 below metal portion 100, dielectric 102 and wire 104 may include any now known or later developed structure, e.g., other interconnects, wires, devices, etc., within an insulator material 108, e.g., silicon oxide ($SiO_2$). In one embodiment, a photoresist 110 is provided over dielectric 102 and wire 104, and includes an opening 112 over metal portion 100. Photoresist 110 may include any conventional or later developed masking material such as organic photoresist, silicon oxide (SiO2), silicon nitride ($Si_3N_4$), silicon carbide (SiC), nitrogenated or hydrogenated silicon carbide (SiC(N, H)), etc.

Next, as shown in FIG. 2, metal portion 100 (FIG. 1) is infused 120 with an infusion species 132 that increases a resistivity of metal portion 100 to form a resistor 130. Infusion 120 may take a variety of forms. In any event, infusion 120 occurs through opening 112 into metal portion 100. In one embodiment, infusion 120 may include performing a gas cluster ion beam infusion to dope metal portion 100 with infusion species 132. Alternatively, infusion 120 may include a thermal salicidation to form a metal silicide 134. In another alternative embodiment, infusion 120 may include a thermal nitridation to form a metal nitride 136. Infusion 120 may also include a combination of the above-described embodiments. In any event, infusion 120 may be selected to include a room temperature process (e.g., gas cluster ion beam), thus preventing thermal damage, or may be a virtually ion free process (e.g., thermal processes), thus preventing plasma damage. Infusion 120 includes using an infusion material 138 that may include any material that is an infusion species 132 or causes infusion of an infusion species 132 into metal portion 100. Infusion species 132 is any material that causes an increase in the resistance of metal portion 100. In one embodiment, infusion material 138 may include one or more of: silane ($SiH_4$) to infuse silicon (Si), nitrogen ($N_2$), methane ($CH_4$) to infuse carbon (C), tantalum (Ta), titanium (Ti), ammonia ($NH_3$) and tungsten (W). Hence, infusion species 132 may include one or more of: silicon (Si), nitrogen ($N_2$), carbon (C), tantalum (Ta), titanium (Ti) and tungsten (W). Infused metal portion, i.e., resistor 130, thus may include a resistor material such as: copper (Cu) infused with at least one of silicon (Si), nitrogen ($N_2$), tantalum (Ta), titanium (Ti) and tungsten (W), or aluminum infused with at least one of silicon (Si), nitrogen ($N_2$), tantalum (Ta), titanium (Ti) and tungsten (W). Each of these materials provides a high resistivity metal resistor. For example, copper silicide ($Cu_3Si$) provides a resistivity of approximately 60 µohm-cm, copper silicon-nitride ($Cu_3Si_xN_y$) provides a resistivity of approximately 150 µohm-cm and copper silicon oxide ($Cu_3Si_xO_y$) provides a resistivity of greater than approximately 200 µohm-cm.

Figure 4:
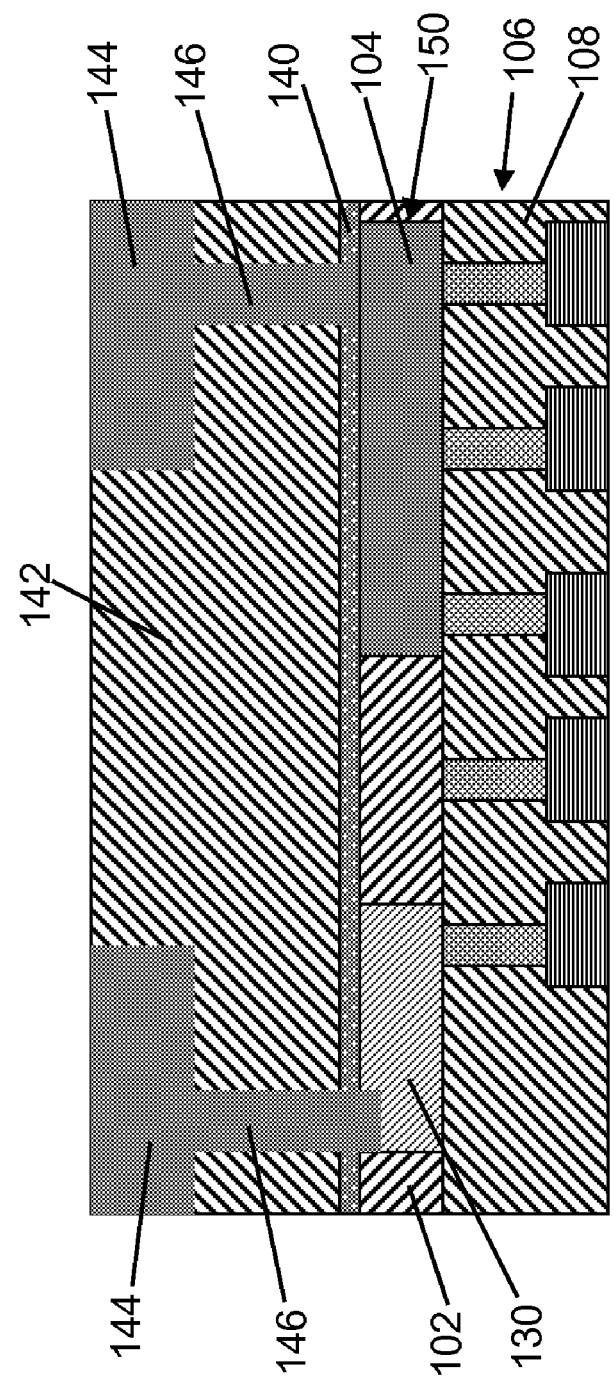

FIGS. 3 and 4 show subsequent processing to finalize metal resistor 130. FIG. 3 shows removal of photoresist 110 (FIGS. 1-2) using, for example, chemical striping or chemical mechanical polishing (CMP). FIG. 4 shows forming a capping layer 140 (e.g., silicon carbide (perhaps hydrogenated or nitrogenated), silicon nitride ($Si_3N_4$), silicon oxide ($SiO_2$), etc.); a dielectric 142 (e.g., hydrogenated silicon oxycarbide (SiCOH), SiLK® available from Dow Chemical, porous dielectrics, etc.); conductor wires 144 (e.g., copper (Cu), aluminum (Al), etc.) and contacts 146 (e.g., copper (Cu), aluminum (Al), etc.). The above-described structures may be formed using any now known or later developed techniques.

The above-described metal resistor 130 and methods provide metal resistor 130 positioned within a same level 150 as interconnect wire 104. The methods described are fully compatible with current BEOL processes of manufacturing, and thus do not add complexity. Furthermore, the above-described method has the added advantages that: it does not require additional masks or extra material layers (reduces costs), does not require etching stop material required to be located over the thin film resistor regions, metal resistor 130 can be photographically defined and etched rather than be defined by lift-off, and the resistivity can be determined by infusion species 132 and the amount of infusion species 132 in metal portion 100, thus offering better resistor control.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a metal resistor, the method comprising: providing a metal portion in a dielectric; and infusing the metal portion with an infusion species that increases a resistivity of the metal portion to form the resistor, wherein the infusing step includes infusing the infusion species using an infusion material selected from the group consisting of: silane ($SiH_4$), methane ($CH_4$), tantalum (Ta), titanium (Ti), ammonia ($NH_3$) and tungsten (W).

2. The method of claim 1, wherein the metal portion includes a material selected from the group consisting of: copper and aluminum.

3. The method of claim 1, wherein the infusing includes performing at least one of: a gas cluster ion beam infusion, a thermal salicidation and a thermal nitridation.

4. The method of claim 1, wherein the infused metal portion is selected from the group consisting of: copper (Cu) infused with at least one of, carbon (C), tantalum (Ta), titanium (Ti) and tungsten (W), and aluminum infused with at least one of silicon (Si), nitrogen ($N_2$), carbon (C), tantalum (Ta), titanium (Ti) and tungsten (W).

5. The method of claim 1, wherein the providing includes positioning the metal portion at a same level as a laterally extending interconnect wire.

* * * * *